United States Patent [19]

Edme et al.

[11] Patent Number: 5,235,541
[45] Date of Patent: Aug. 10, 1993

[54] INTEGRATED CIRCUIT ENTIRELY PROTECTED AGAINST ULTRAVIOLET RAYS

[75] Inventors: Franck Edme, Aix En Provence; Olivier Adjemian, Marseille, both of France

[73] Assignee: SGS-Thomson Microelectronics, S.A., Gentilly, France

[21] Appl. No.: 627,829

[22] Filed: Dec. 14, 1990

[30] Foreign Application Priority Data

Dec. 14, 1989 [FR] France .................. 89 16649

[51] Int. Cl.$^5$ .............................................. G11C 7/02
[52] U.S. Cl. ...................................... 365/53; 365/185; 257/659
[58] Field of Search ............... 365/185, 53; 357/23.5, 357/30 L, 84; 257/315, 316, 317, 318, 319, 659

[56] References Cited

U.S. PATENT DOCUMENTS

| | | | |
|---|---|---|---|
| 4,519,050 | 5/1985 | Folmsbee ............................ | 365/53 |
| 4,530,074 | 7/1985 | Folmsbee ............................ | 365/53 |
| 4,577,295 | 3/1986 | Eitan et al. ......................... | 365/185 |
| 4,758,869 | 7/1988 | Eitan et al. ......................... | 257/659 |
| 4,805,138 | 2/1989 | McElroy et al. ................... | 365/53 |
| 4,970,565 | 11/1990 | Wu et al. ............................ | 357/23.5 |
| 5,034,786 | 7/1991 | Eitan .................................. | 357/23.5 |
| 5,050,123 | 9/1991 | Castro ................................ | 365/53 |
| 5,086,410 | 2/1992 | Bergemont ........................ | 365/53 |

FOREIGN PATENT DOCUMENTS

| | | |
|---|---|---|
| 0044384 | 1/1982 | European Pat. Off. . |
| 0227549 | 7/1987 | European Pat. Off. . |
| 0715932 | 1/1984 | Japan . |

Primary Examiner—Eugene R. LaRoche
Assistant Examiner—Son Dinh

[57] ABSTRACT

An integrated circuit ultraviolet-unerasable floating-gate memory, which includes EEPROM (or EPROM) memory cells totally enclosed by a metal mask. The metal mask includes metal projections which are anchored in substrate diffusions, to define a ring completely surrounding two (or four) floating-gate cells. The cells are single-polysilicon cells, in which the control gate is a diffusion. Signals are routed out through diffusions which go underneath the metal ring. A selection transistor, for each cell, is located outside the metal ring.

31 Claims, 4 Drawing Sheets

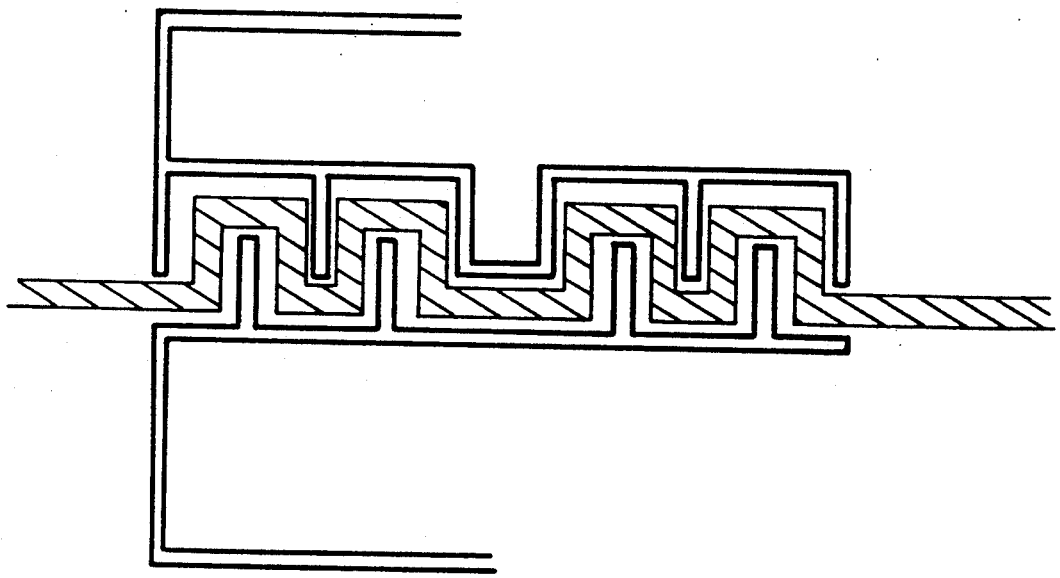
FIG_1  PRIOR ART
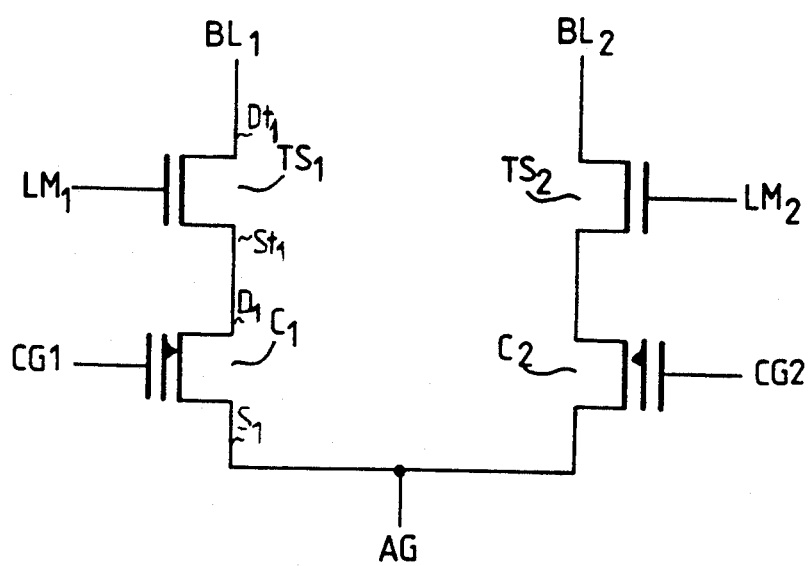
FIG_3

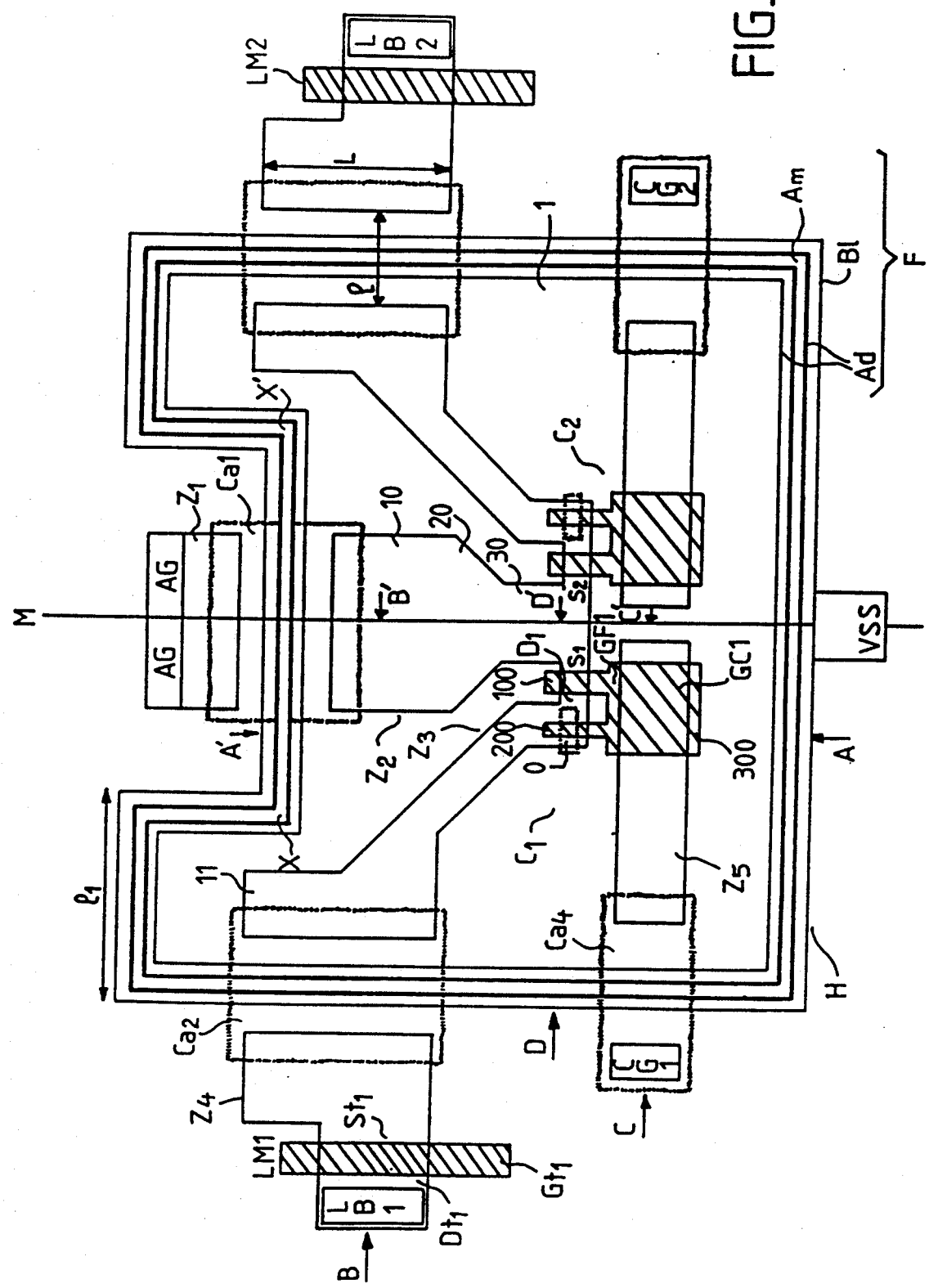
FIG_2

FIG_4-a
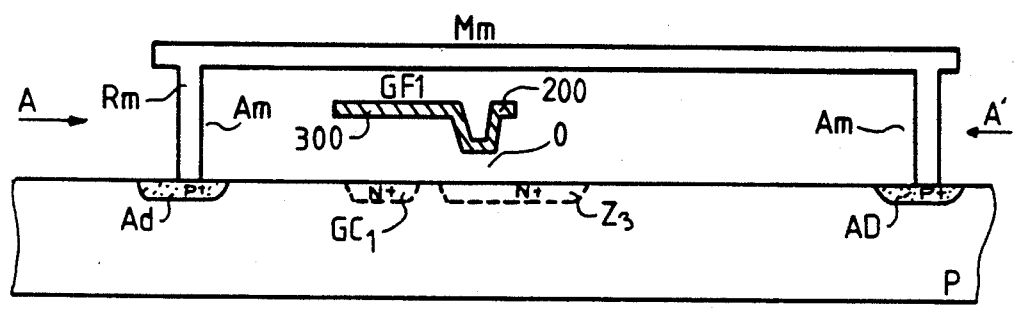
FIG_4-b
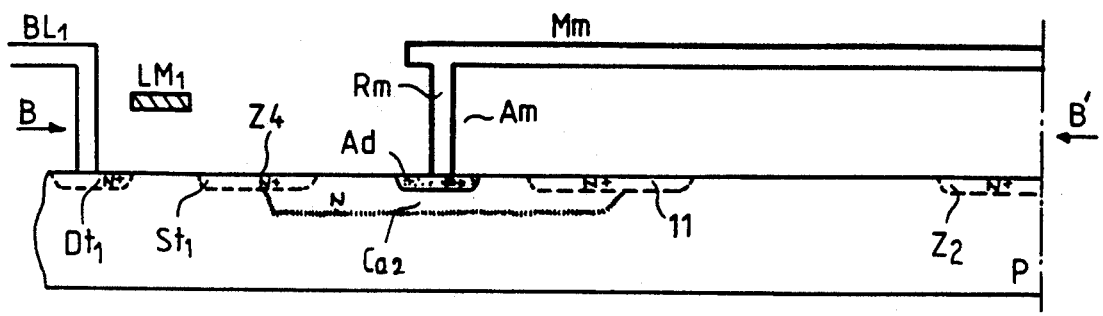

FIG_4-c
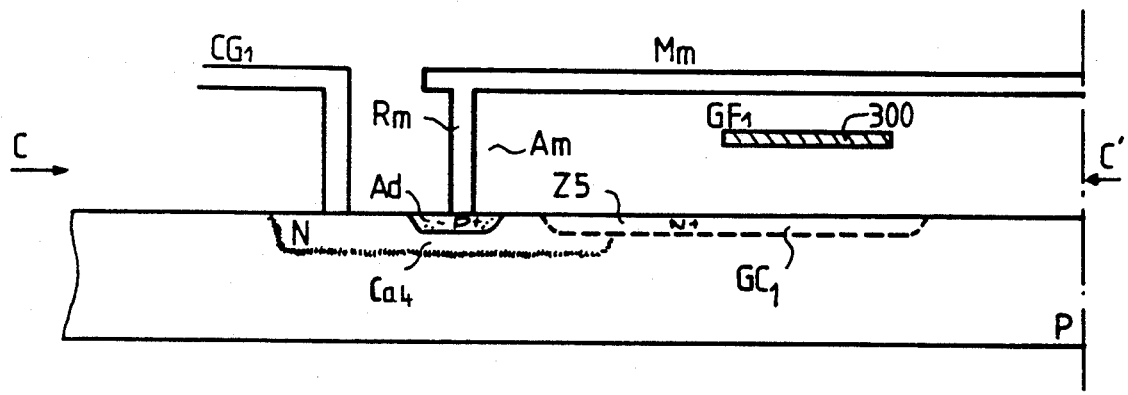
FIG_4-d
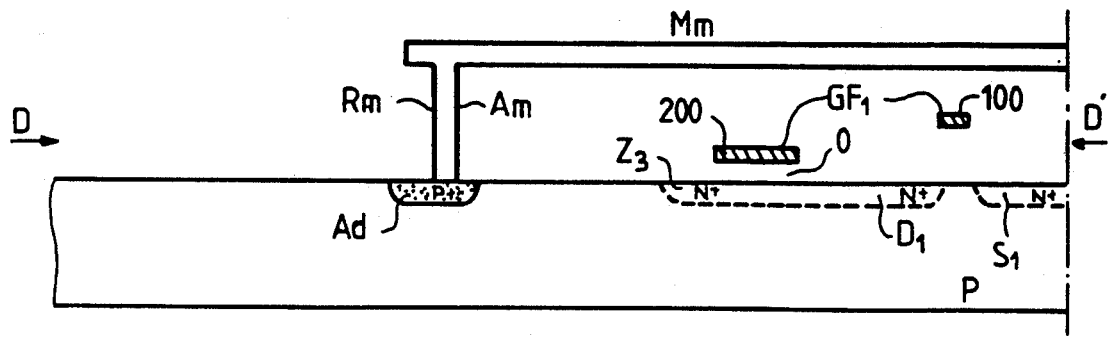

INTEGRATED CIRCUIT ENTIRELY PROTECTED AGAINST ULTRAVIOLET RAYS

BACKGROUND OF THE INVENTION

1. Field of the Invention

The object of the present invention is an integrated circuit protected against ultraviolet rays. It can be applied to integrated circuits made by MOS technology and, especially, to integrated circuits that include floating-gate memory cells.

It is common practice to use floating-gate memory cells to customize an integrated circuit when it comes off the production line and after the testing sequence. This customizing is designed, inter alia, to establish the various access paths and to permit or bar the reading of memory zones. These memory cells are then used as fuses. They are, of course, also used in a standard way in integrated circuit memory zones.

These floating gate memory cells are sensitive to ultraviolet rays which undo the storage of the charges at the floating gate. Now any user can subject a circuit to the ultraviolet rays. It is therefore important, in certain applications, to protect the circuit against the ultraviolet rays, for example in applications requiring high security with respect to the keeping of information in a memory. Thus, it is necessary to ensure that certain users can have total immunity to ultraviolet rays for a number of years.

2. Description of the Prior Art

In a known way a metal mask, made of aluminium for example, is placed on the integrated circuit. Thus, for example, UUPROMs (Ultraviolet Unerasable PRogrammable Memories) are made out of EPROM cells. Experience shows that the protection provided by these cells against ultraviolet rays is limited in time.

In a first exemplary embodiment, this protection lasts only a few weeks. This is not enough for certain applications.

In this example, a metal mask is placed on the cell in a horizontal plane. This metal mask isolates the element of the cell to be protected, namely the floating gate, from the ultraviolet rays. Since, however, there is no shielding between the plane of the substrate and that of the metal mask, ultraviolet rays may reach the floating gate indirectly, by reflection between the substrate and the metal plane, thus undoing the storage of the charges that have collected therein: the immunity to ultraviolet rays does not go beyond a few weeks.

To circumvent this lack of efficiency, a second exemplary embodiment uses metal projecting features or projections vertical to the metal plane. These projections are anchored in the substrate around the cell to be protected. In fact, these metal projections are anchored in diffusions that are of the same type as but are more highly doped with impurities than that of the substrate. They are contact-making diffusions, for example P+ diffusions made in a P type substrate.

A floating-gate memory cell should, however, have its source, its drain and its control gate connected to conductive lines conveying the control signals that enable the reading, programming or erasure of this cell. Even if this cell is isolated with the metal projections anchored in P+ contact-making diffusion, it must be possible, all the same, to make these connections to the conductive lines. This can be done for the source and the drain which in the present example of a P type substrate, are made by N+ type diffusions. It suffices to make a N type well within which the contact-making P+ type diffusion will be made to anchor the metal projections Rm. And two N+ type diffusions will be made straddling the substrate and the well. One of them, for example, will be the source of the cell while the other, for example, will provide for the metal contact of a conductive line. It is in fact necessary to make an N type well such as this for it is technologically not possible to make a P+ type diffusion directly in an N+ type diffusion, because of their respective levels of impurity.

It is the connection of the control gate, which is formed by a polysilicon region, that raises problems. For, the polysilicon region which constitutes the control gate is above the plane of the substrate but beneath the metal plate. It prevents a vertical projection, as described, at its position. It is possible neither to cut the polysilicon gate nor to connect the control gate to the metal plate which is connected to a potential: the control gate would be short-circuited. In practice, there are no metal projections at the connection between the control gate and the exterior. The cell is not entirely isolated.

It is true that, in this example, the possible inlets for ultraviolet rays have been reduced, but these rays can still get through, via the polysilicon control gate. And, by reflection between the metal plane and the substrate, these rays could reach the floating gate. The period of immunity is thus increased by a few months. For applications requiring a minimum immunity of four to five years, the result is unsatisfactory.

In a third example of an embodiment, the trace of the polysilicon control gate was then modified so as to attenuate the rate of reflection of the ultraviolet rays. An example of an embodiment such as this is shown in FIG. 1. This top view of the circuit shows two metal lines representing the impact on the substrate of the vertical projections of metal. These lines are depicted, in FIG. 1, by a zone demarcated by thick lines.

FIG. 1 also shows a polysilicon line, cross hatched in the drawing, which goes through the two metal lines without being in contact with them. On the inner side of the protected zone, the polysilicon line makes several 90° turns, along a directing axis. The two metal lines follow the winding path of the polysilicon line on either side of it. By these intertwined metal and polysilicon zigzags, the reflections of the ultraviolet rays are highly attenuated and several years of immunity to ultraviolet rays are thus obtained.

However, this is achieved to the detriment of the area occupied by the cell. For, these zigzags along an axis of direction entail a high cost in terms of space. And their cost in terms of space is all the higher as the desired period of immunity is great. Thus, in the current state of the art, four years' immunity is obtained for a length of the order of 200 $\mu$m on the axis of direction of the zigzags. Given that, in this same state of the art, the EPROM cell normally occupies an areas of the order of 180 $\mu$m$^2$, it is seen that this increase in area is a major drawback in practice, for it is always sought to reduce the areas with a view to ever greater integration density. Moreover, this addition of materials leads to additional manufacturing costs.

SUMMARY OF THE INVENTION

It is an object of the invention to overcome these drawbacks by proposing a different cell structure that enables, firstly, the making of a ring formed by metal projections that are continuous around the cell and, secondly, a significant reduction in the surface dimension of the UUPROM cell thus obtained.

An object of the present invention, therefore, is an integrated circuit made by MOS technology using a semiconductor substrate with a first type of doping, including at least one floating gate memory cell, having a source, a drain and a control gate and being protected from ultraviolet rays by a metal mask that covers it on an upper surface, this mask having anchoring points on the semiconductor substrate made by metal projections of the metal mask, wherein the floating gate memory cell has a control gate made by a diffusion of the second type of doping and wherein these anchoring points form a continuous metal ring, anchored in a diffusion ring that is of a same type but is more highly doped than the substrate and wider than the metal ring, said metal ring completely isolating the floating gate memory cell of the integrated circuit from ultraviolet rays, in a zone internal to the metal ring, and the drain, the source and the control gate being connected to the exterior of the ring Am by diffused connections.

BRIEF DESCRIPTION OF THE DRAWINGS

The characteristics and advantages of a circuit according to the invention are given in the following description. This description is made with reference to the appended drawings, by way of indication, and they in no way restrict the scope of the invention. Of these figures:

FIG. 1 shows a top view of an intersection of a polycrystalline silicon line with two metal lines in the prior art of protection against ultraviolet rays, already described here above;

FIG. 2 shows a top view of a part of a circuit which is protected against ultraviolet rays in accordance with one embodiment of the present invention;

FIG. 3 is the electronic equivalent circuit diagram of the function shown in a top view in FIG. 2;

FIG. 4a is a sectional view along AA' of FIG. 2;
FIG. 4b is a sectional view along BB' of FIG. 2;
FIG. 4c is a sectional view along CC' of FIG. 2; and
FIG. 4d is a sectional view along DD' of FIG. 2.

DETAILED DESCRIPTION OF THE INVENTION

FIG. 2 shows a plane top view of an integrated circuit zone, protected against ultraviolet rays according to one embodiment of the invention.

In this embodiment, two floating gate memory cells $C_1$ and $C_2$, having symmetrical structures with respect to an axis M, are shielded from ultraviolet rays in the same internal zone 1. This internal zone 1 is demarcated in the plane of FIG. 2 by a continuous metal ring Am delineated in thick lines in FIG. 2. In the plane of FIG. 2, the ring Am is represented by the impact of the vertical projections of metal of a metal mask. The width of this metal ring is limited by two end parallel borders and its height is limited by the plane of the substrate and the plane of the metal mask. Its geometrical shape in the plane of FIG. 2 is defined as follows:

two equal, facing parallel sides, vertically sandwich the internal zone 1;

a horizontal side H joins the two vertical left-hand and right-hand sides by their bottom ends;

from the top end of the vertical left-hand side, one side goes perpendicularly rightwards along a length $l_1$, then makes a 90° downward turn to reach an end X of a perpendicular segment XX' pointed rightwards from the end X, from the top end of the vertical right-hand side, one side goes perpendicularly leftwards along a length $l_1$, then makes a 90° downward turn to reach an end X' of the segment XX';

the axis of symmetry M is the mediatrix of the segment XX'.

In the plane of FIG. 2, the surface of the metal ring is included entirely in the area of a diffusion ring Ad. The two end borders which demarcate the width of the diffusion ring Ad are parallel to the end borders of the ring Am that it contains: the ring Ad has the same shape as the ring Am which it contains. Besides, the ring Ad is bordered by a limit border B1 on its farthest external border, its farthest internal border demarcating the internal zone 1.

Hereinafter, the unit formed by the rings Am and Ad and the border B1 shall be called a boundary F. And the example taken shall be that of a P type substrate.

Beneath the boundary, at the segment XX', an N type well Ca1 is demarcated by a parallelogram. The boundary F goes through it, in parallel to two sides of the parallelogram, seen from the top.

In a preferred example, the parallelogram of the well Ca1 is a rectangle, the longest two sides being parallel to the portion of boundary F that goes through the well Ca1. The mediatrix of the sides of the well Ca1 parallel to the boundary is the same as the mediatrix M of the segment XX' which is still the axis of symmetry M of the circuit in this exemplary embodiment of the invention. In FIG. 2, the well Ca1 is demarcated by fringed lines.

Straddling the substrate and a part of the well Ca1, outside the boundary, an N+ diffused zone Z1 is demarcated by a parallelogram. A metal contact to signal AG is made on an entire part of that end of the diffused zone Z1 which is external to the boundary F. This metal contact is made in the substrate. AG is the array ground of a memory plane (not shown) containing the cells $C_1$ and $C_2$.

In the example, this parallelogram Z1 is rectangular. The two longest sides of the diffusion Z1 are parallel to the two longest sides of the well Ca1. They are also shorter; their mediatrix is the same as the axis of symmetry M.

Straddling the well Ca1 and the substrate on the inner zone 1 side, a part 10 of an N+ diffused zone Z2 has the same shape, with a longest dimension that is equal and parallel to that of the facing diffused zone Z1. The diffused zone Z2 is symmetrical with the axis M. The part 10 is extended by an oblique contraction 20, having M as its axis of symmetry, towards a new parallelogram 30 having M as its axis of symmetry. This last part 30 of the diffused zone Z2 continues by an N+ diffused zone which extends on its greatest length perpendicularly to the axis of symmetry M and symmetrically on either side of this axis. To the left of the axis M, it is the source $S_1$ of the cell $C_1$. To the right, it is the source $S_2$ of the cell $C_2$.

In fact, this arrangement enables the source $S_1$ and the source $S_2$ to be connected to the array ground sign AG by a single conductive link formed by the zone Z2, the well Ca1, the zone Z1 and the metal contact by which the array ground AG signal is transmitted. However, this conductive link thus formed is actually the combination of two conductive links, each of the links notably having sufficient width for the current surge from each of the sources $S_1$ and $S_2$.

The rest of the description concerns the half-plane to the left of the axis M which contains the cell $C_1$. The description applies symmetrically (in relation to the axis of symmetry M) to the right-hand plane which contains the cell $C_2$.

The memory cell $C_1$ has a source zone $S_1$ and a drain zone $D_1$ which are N+ diffusions, a floating gate $GF_1$ made in the form of a polysilicon region and a control gate $GC_1$ which is an N+ diffusion in the zone.

Going leftwards from the N+ diffused zone of the source $S_1$: this source $S_1$ is cut perpendicularly at its greatest length, i.e. vertically, by a rectangular arm 100 of the floating gate $GF_1$. The axis of the greatest length of the arm 100 is vertical. Aligned with the horizontal axis of the greatest length of the zone $S_1$, to the left of the arm 100, there is the N+ diffused zone of the drain $D_1$ of the cell $C_1$. To the left of this zone $D_1$, another arm 200 of the floating gate $GF_1$ passes above the zone $D_1$ perpendicularly to its greatest length (i.e. vertically in the description). The arm 200 has the same shape in the plane of the FIG. 2 as the arm 100, but it is narrower. At the top end of the arm 200, the diffusion zone $D_1$ continues into another N+ diffusion zone Z3 which goes vertically upwards and then quickly takes a leftward oblique direction towards the top of the internal zone 1. This zone Z3 ends in a preferably rectangular parallelogram 11. The diffusion Z3, in this part 11, is made so as to straddle the substrate of the internal zone 1 and a well Ca2.

The well Ca2 is preferably rectangular. Its two longest sides are parallel to those of the parallelogram 11 of the facing zone Z3 and are longer. The well Ca2 is crossed by the vertical left-hand side of the boundary, in parallel to its two longest sides.

Outside the boundary, straddling the substrate and the well Ca2, there is an N+ diffusion Z4. This diffusion Z4 has the same shape as and its greatest length is equal to that of the part 11 of the facing diffusion Z3. This diffusion Z4 has a narrower part to the left which also forms a parallelogram and sets up the source $St_1$ of the selection transistor $TS_1$. This diffused part $St_1$ is cut to the left and perpendicularly by a polysilicon region which sets up the control gate $Gt_1$ of the selection transistor and conveys a word line signal $LM_1$.

This polysilicon region cuts the drain diffusion zone $Dt_1$ of the transistor $TS_1$ to the left and perpendicularly, said diffusion zone $Dt_1$ facing that of the source $St_1$. A metal contact is made on this diffusion zone $Dt_1$. This metal contact transmits a bit line signal $LB_1$ to the drain $Dt_1$ of the selection transistor $TS_1$.

Indirectly, by means of the well Ca2 and the diffusion zone Z4, the diffusion zone Z3 connects the drain $D_1$ of the cell $C_1$ to the source $St_1$ of the selection transistor $TS_1$ (FIG. 3).

As we have seen indeed, the zone $D_1$ is extended by the diffusion zone Z3.

Besides, the arm 200 of the floating gate $GF_1$ approaches the substrate at one place, thus reducing the oxide thickness at this position, notably in the vicinity of the drain $D_1$: this region of smaller oxide thickness (for example a thickness of 90 Angstroms) is called a tunnel oxide region O (FIGS. 4.$d$, 4.$a$). It promotes the transfer of charges between the drain D1 and the floating gate $GF_1$.

At their bottom end, the two arms 100 and 200 meet a parallelogram 300 which is at a lower position than the aligned zones of the source $S_1$ and drain $D_1$ of the cell $C_1$. This part 300 of the gate $GF_1$ covers an N+ diffusion Z5 which sets up the control gate $GC_1$ beneath this floating gate. The diffusion Z5 is extended leftwards, towards the boundary where it ends astride the substrate of the internal zone 1 and an N type well Ca4 made on either side and beneath the boundary, like the wells Ca1 and Ca2 which have already been seen. The boundary crosses in parallel to two parallel sides of the well Ca4 which is preferably a parallelogram. These are the shortest sides which are, this time, the sides parallel to the boundary. A metal contact is made on one part of the well of the side external to the boundary. It conveys a gate control signal $CG_1$ for the control gate $GC_1$ of the cell $C_1$.

The signals AG, LB1, LM1 and CG1 are the four control signals associated with the selection transistor $TS_1$, and the memory cell $C_1$. By their state they activate an operation for the reading, programming or erasure of the cell $C_1$. An example of the states corresponding to a reading, a programming or an erasure are given in the following table:

|  | CG1 | LM1 | LB1 | AG |
|---|---|---|---|---|
| Programming | Vss | 20v | 20v | Unconnected |
| Erasure | 20v | 20v | Unconnected | Vss |
| Reading | 2v | 5v | Towards the reading circuit | Vss |

Vss is the electrical ground of the circuit to which the metal mask is connected and, therefore, also the diffusion ring Ad.

We have seen that the contact-making diffusion ring Ad is advantageously wider than the ring Am which it contains entirely. Indeed, the vertical projections are, for example, obtained by hollowing out the circuit up to the substrate, according to well-known technological methods. Holes are then formed, the bottom of which is constituted by the surface of the substrate. The substrate thus bared should not be wider than the contact-making diffusion flush with the substrate for, otherwise, there is a risk that the metal will come into contact with itself not only on this diffusion but also on either side of this diffusion, with the risks of shorting that this entails.

Outside the contact-making diffusion ring Ad, in relation to the internal zone 1, the limit border B1 represents the geometrical projection of the contours of the mask of the metal, in the plane of FIG. 2. In the example described and as can be seen in FIGS. 4a to 4d, the metal mask Mm goes over the vertical metal projections Rm. This makes it possible to ensure, in a reliable way, that when the metal layer is applied, it will really fill all the holes up to the bottom, i.e. up to the surface of the substrate. Since the metal layer is spread, it is indeed preferable to have a plane surface on either side of the hole.

The memory cell $C_1$ has a floating gate $GF_1$ and a control gate $GC_1$. Its essential feature used in the invention is that its control gate is a diffusion and not a polysilicon gate as for the UUPROM cells in the prior art. For, a cell having its control gate in the form of a diffusion and its floating gate in the form of polysilicon is substantially wider than a cell with two levels of polysilicon (floating gate and control gate). Indeed, it has been seen that the control gate $GC_1$ in diffusion form has been offset in the plane, with respect to the source region $S_1$ and drain region $D_1$. The floating gate then overlaps, firstly, the drain and source region and, secondly, the control gate. In a cell with two polysilicon levels, the control gate covers the floating gate which itself covers the source and drain regions. A structure such as this is therefore more dense than the spread-out structure of the cell with only one polysilicon level. This fact of using a greater area is, moreover, the major drawback of this technology of only one polysilicon level. However, it will be shown further below that, for the making of the UUPROM cell, this major drawback becomes a definite advantage. Moreover, the reduction to only one level of polysilicon eliminates one mask level: this technique costs less in terms of masks.

In the example, it has been chosen to show an EEPROM cell and a possible embodiment of such a cell. However, it is clear that the invention is restricted neither to this exemplary embodiment nor to this type of cell. For example, it would have equally well been possible to depict an EPROM cell. The only restriction is that the cell has a floating gate, an element that is capable of being discharged by ultraviolet rays.

An EEPROM is necessarily controlled by a selection transistor once it is sought to have at least two out of the three commands, namely the commands for the reading, programming and erasure of the cell. The electrical diagram corresponding to FIG. 2 is given in FIG. 3. The selection transistor $TS_1$ and the memory cell $C_1$ have the same type of channel, with doping opposite to that of the substrate.

The description given with reference to a P type substrate can easily be transposed to an N type substrate, by reversing the type of impurities and the bias in this description.

The EEPROM cell is non-symmetrical in the example: the drain $D_1$ and the source $S_1$ are not interchangeable. The drain $D_1$ is, in effect, given its specific character by a thin oxide region O, beneath the arm 200 of the floating gate GF1, which facilitates the transfer of the charges by tunnel effect. This is what is shown by a section DD' in FIG. 4d, with the tunnel oxide zone O beneath the arm of the floating gate $GF_1$.

The N+ diffusion of the control gate $GC_1$ is made before the polysilicon region 300, above it. The N+ diffusion is then quite present beneath the floating gate, as can be seen in the sectional views AA' and CC' of FIGS. 4a and 4c respectively.

The foregoing two paragraphs describe a possible embodiment of an EEPROM cell $C_1$ with only one polysilicon level in an internal zone 1. This cell structure enables all the signals to pass between the internal zone 1 and the exterior of the boundary defined by the rings Am and Ad under conduction by means of a well beneath this boundary. These are diffused connections, i.e. connections made in the substrate beneath the boundary. Thus, for each of the signals listed hereinafter, it is this type of connection that has been used:

the control gate $GC_1$, to be connected to the control signal $CG_1$ of the gate: well Ca4;

the source $S_1$ of the cell $C_1$ to be connected to the array ground AG: well Ca1;

the diffusion Z3, connected to the drain $D_1$ of the cell $C_1$, to be connected to the source $St_1$ of the transistor $TS_1$: well Ca2.

Let us take the example of the N type well Ca2. After this well Ca2 (N type diffusion in the substrate P) has been made, the P+ type diffusion of the contact-making ring Ad (FIGS. 2 and 4b) is made in this well Ca2: this P+ type diffusion therefore occupies, in its entirety, the greatest length of the well seen in a top view (FIG. 2). Then, an N+ type diffusion is made on either side of the P+ type diffusion, straddling the well Ca2 and the P type substrate. In the example these N+ type diffusions are Z4, which is extended by the source $St_1$ and Z3. The conduction takes place between the two N+ type diffusion zones, Z3 and Z4, through the well Ca2, beneath the contact-making ring Ad and hence, also, beneath the metal ring Am. A first diffusion zone is therefore in the internal zone 1: this first diffusion zone is Z3 in the example. A second diffusion zone is outside: it is Z4 in the example.

In certain examples, it is possible not to make this second diffusion and to make a metal contact directly on the N type diffusion of the well, outside the boundary. In the example of FIG. 2, it is thus that the metal contact associated with the command of the control gate $CG_1$ is made. This second possible embodiment is shown in a sectional view in FIG. 4c. Everything depends on the topology of the circuitry which generates, for example, $CG_1$. Thus, if the signal $CG_1$ is generated far from the UUPROM cell, it will be conveyed to this cell by a metal line. The metal contact will then be made directly on the well Ca4 in the example. On the contrary, if the signal $CG_1$ has come from a transistor very close to the UUPROM cell, it will arrive by an N+ diffusion, and an N+ contact on the well will become necessary: this is so in the example of the well Ca2 for the signal $St_1$. These metal contacts are made outside the boundary. For, if they were made within the boundary, it would be necessary to cause the metal conductor which conveys a control signal to be crossed either by the metal mask or the projections Rm of this metal mask which are connected to the ground potential Vss: a short-circuit would be provoked.

The setting up of the N type well and of the P+ diffusion adds two supplementary operations to the making of the cell. By contrast, the corresponding masks exist and only their design has to be modified, as is the case with the design of the mask of the N+ type diffusions to be made.

It is because it is necessary to prevent the conduction of the different PN diodes, constituted by the following junctions:

P+ diffusion and N well,

P substrate and N well, that the metal mask is connected to the ground plane Vss of the circuit. Thus, these different diodes are always reverse biased and off.

Besides, the ratio of the width 1 between two N+ diffusions on either, side of a well on the boundary to the greatest length L of these N+ diffusions parallel to the boundary is made as small as possible while at the same time abiding by the rules of design so as to achieve a maximum reduction in the resistance R induced by the N well. Indeed, the resistivity p of the N well is higher than that of an N+ diffusion for the resistivity of a diffusion is inversely proportional to the doping level. Now, the induced resistance R has the direct consequence, on the control signals, of increasing the access time of the cell whereas the constant aim is to reduce this access time. It may be recalled that the value of this induced resistance, R, is given by the following expression:

$$R = (1/L) \times p$$

According to the invention, preferably a ratio 1/L that is optimum for a minimum induced resistance is chosen. In particular, it is in line with this thinking that the diffusions are made, in the example, for the diffused connections linked to the signal AG and to the source $St_1$ of the selection transistor.

In the foregoing, we have seen how the P+ type contact-making diffusion is set up in an N well. Apart from the wells made to provide for the conduction of the control signals, the P+ diffusion is made directly in the P substrate, as can be seen, for example, in the section along AA' in FIG. 4a and in the section along DD' in FIG. 4d.

It is thus that it is possible to achieve a continuous anchoring of the metal projections in a P+ diffusion, this diffusion being done sometimes in the P substrate and sometimes in an N well to provide for the conduction of the control signals within the boundary.

It is thus possible to achieve the total protection against ultraviolet rays of any cell or any set of cells which, within a certain perimeter, has all its control signals conveyed in diffusion structure: the contact-making ring Ad and the vertical metal projections anchored in the ring Ad will be made on this perimeter.

In the case of an EEPROM cell which is controlled by a selection transistor $TS_1$, this selection transistor $TS_1$ is preferably placed outside this perimeter for its control gate is made of polysilicon. Besides, this is not troublesome as it does not have to be protected from ultraviolet rays.

For, it would be technically possible to make a metal contact out of a metal line above the control gate, between this control gate made of polysilicon and an N+ diffusion, to provide for the conduction between these two parts. It is also possible to use a buried-contact technology enabling the polysilicon to be connected directly to a diffusion or to the substrate. However, this last-named technology is a costly one that is difficult to implement. By using such techniques, it is possible, however, to include the selection transistor in the internal zone 1, by making a connection between this N+ diffusion and the exterior of the boundary.

However, this approach has a great many drawbacks. First of all, it increases the number of wells needed for the connections between the internal zone 1 and the exterior. For, if the selection transistor $TS_1$ is placed outside, only the source $St_1$ has to be connected in the internal zone 1. By placing it inside, not only the diffusion associated with the control gate but also that of the drain $Dt_1$ has to be connected to the exterior. In this case there is then an additional well and, therefore, the final area occupied by the protected cell is greater. Furthermore, the selection transistor $TS_1$ then has the two control line signals $LB_1$ and $LM_1$ which are transmitted by means of a well beneath the boundary. This causes deterioration in the time of access to the transistor and hence to the cell. Finally, the metal contact between the control gate and an N+ diffusion should be achieved by a metal line, located in a plane above the control gate, this metal line having two projections at its two ends, one at the gate and one on the diffusion. Since the metal line cannot be in the plane of the mask of the metal, there will be a second metal plane between the first metal plane of the metal mask and the control gate. There would therefore be two metal levels and an increase in the number of layers of the circuit. Moreover, in practice, only one level of metal is desired in an integrated circuit, especially a memory integrated circuit. Finally, the large number of contacts and conduction modes tends to increase the access time (i.e. with conduction by means of a well, metal contact between an N+ diffusion and a polysilicon region).

It may be noted however that, according to this technique, it is possible to achieve the total protection, according to the invention, of a floating gate having its control gate made of polysilicon and having a metal contact with an N+ diffusion. However, we have seen the drawbacks of a metal contact technique such as this, and the first manufacturing technique described will be preferred to it. This makes it particularly worthwhile to choose an EEPROM cell with a control gate made in the form of an N+ diffusion region, located beneath the floating gate, and a selection transistor placed outside the boundary. In this case, the metal lines referred to here above become unnecessary.

Finally it will be noted that, in the invention, it is not necessary for the metal projections to be vertical: this is a characteristic arising purely out of the exemplary method described for obtaining these projections. All that is necessary is that these projections should connect the metal mask to the substrate and that they should be anchored continuously in a diffusion of the substrate so as to completely isolate the internal zone from the ultraviolet rays.

In the example of FIG. 2, there are two memory cells $C_1$ and $C_2$ in the internal zone 1. We thus have a double UUPROM cell.

The use of a cell with diffused control gate has enabled, firstly, the total protection of a floating gate memory cell against ultraviolet rays, in enabling this result to be achieved simply, in principle and, above all, in its practical embodiment since it does not increase the number of masks needed. Secondly, it has made it possible (and this is a considerable advantage from the viewpoint of integration density) to achieve a major reduction in the area occupied by a UUPROM cell such as this. In the example of the double cell, it is possible to obtain, for example, an area of 242 $\mu m^2$. Besides, the technology associated with the control gate cells in diffusion form is simpler and more reliable than that of cells with two polysilicon levels because there is no interpoly layer between the floating gate and the control gate. These advantages are therefore reflected in the reliability of UUPROM cells such as these according to the invention.

In the example, the cells $C_1$ and $C_2$ have their source $S_1$ and $S_2$ at the same array ground signal AG: this signal is in fact common to the entire memory plane and the cells $C_1$ and $C_2$ are independent. Other configurations are possible, depending on the logic function to be set up. In the example, the area occupied by two memory cells, protected against ultraviolet rays according to the invention, is reduced by twice the area of a ring line Ad along the axis M, as compared with the area occupied by two memory cells, each protected independently against ultraviolet rays in accordance with the invention. There could also be a structure such as this with three or four cells, by using a symmetry with respect to the bottom horizontal side H.

Finally, the cell can also be applied to only one cell by itself.

What is claimed is:

1. An integrated circuit using a semiconductor substrate with a first type of doping, comprising
   at least two floating gate memory cells, each having a source, a drain and a control gate and being protected from ultraviolet rays by a metal mask that covers said floating gate memory cells on an upper surface thereof, said mask having anchoring points on said semiconductor substrate made by metal projections of said metal mask, wherein each floating gate memory cell has its control gate made by a diffusion of a second type of doping which is opposite to said first type of doping and wherein said anchoring points form a continuous metal ring, anchored in a diffusion ring that is of a same type but is more highly doped than the semiconductor substrate and wider than the metal ring, said metal ring completely isolating each floating gate memory cell of the integrated circuit from ultraviolet rays, in a zone internal to the metal ring, and the drain, the source and the control gate of each floating gate memory cell being connected by diffused connections to signals in a zone external to the metal ring.

2. The integrated circuit of claim 1, wherein said metal projections of said metal mask are not on the periphery of said metal mask.

3. The integrated circuit of claim 2, wherein said floating gate memory cell further comprises a selection circuit, which is located outside said metal ring.

4. The integrated circuit of claim 2, comprising two of said floating gate memory cells within the boundary of said metal ring, said two floating gate memory cells each having a respective selection transistor, and having, as a common link with each other, only their source connected to the same array ground signal, thus setting up a double UUPROM cell.

5. The integrated circuit of claim 4, wherein said double UUPROM cell has an axis of symmetry which separates it into two symmetrical structures, each having one said floating gate memory cell.

6. The integrated circuit of claim 2, wherein each said diffused connection includes a well and, within this well and the semiconductor substrate, two facing diffusions having respective facing sides of equal length, said length being greater than the distance between said two facing sides.

7. The integrated circuit of claim 1, wherein said floating gate memory cell further comprises a selection circuit, which is located outside said metal ring.

8. The integrated circuit of claim 1, wherein each said diffused connection includes a well and, within this well and the semiconductor substrate, two facing diffusions having respective facing sides of equal length, said length being greater than the distance between said two facing sides.

9. An integrated circuit comprising:
a semiconductor substrate with a first type of doping; said substrate having a contact-making diffusion ring that has a higher concentration of said first type of doping than said substrate;
at least two floating gate memory cells each having a source, a drain, a control gate, and a floating gate; said floating gate of each said floating gate memory cell being dischargeable by ultraviolet rays;
said control gate of each said floating gate memory cell being provided by a diffusion of a second type of doping which is opposite to said first type of doping;
said memory cell being protected from ultraviolet rays by a metal mask which covers said memory cell; said metal mask having anchoring points made by metal projections of the metal mask such that these anchoring points form a continuous metal ring which is anchored in said diffusion ring;
said diffusion ring being wider than said continuous metal ring; said continuous metal ring completely isolating said floating gate memory cells from ultraviolet rays in a first zone which is the area bounded by the continuous metal ring; and said drain, source and control gate of each said floating gate memory cell being connected by diffused connections, which extend beneath said diffusion ring, to signals in a second zone which is external to the continuous metal ring.

10. The integrated circuit of claim 9, wherein said diffusion ring has the same shape as said continuous metal ring, and wherein said diffusion ring extends outwardly beyond the exterior surface of said continuous metal ring and inwardly from the interior surface of said continuous metal ring such that said continuous metal ring is contained within said diffusion ring in a plane containing the anchoring of said continuous metal ring in said diffusion ring.

11. The integrated circuit of claim 10 wherein said diffusion connections are located in at least one well which extends from said first zone to said second zone external to the continuous metal ring.

12. The integrated circuit of claim 11 wherein said substrate is a P type material, wherein said diffusion ring is a P+ type material, wherein said at least one well is an N type material, and wherein said diffusion connections are N+ type diffusions.

13. The integrated circuit of claim 12 further comprising a first N+ diffused zone straddling the substrate and a part of said well outside the outer boundary of said diffusion ring, and a second N+ diffused zone straddling the substrate and a part of said well within said first zone.

14. The integrated circuit of claim 13 further comprising a metal contact on a part of said first N+ diffused zone.

15. The integrated circuit of claim 14 wherein said well has a rectangular shape with the longest two sides being parallel to the portion of said diffusion ring which goes through said well.

16. The integrated circuit of claim 10 having at least first, second, and third wells in said substrate, each of said first, second, and third wells extending from said first zone to said second zone external to the continuous metal ring, wherein said diffusion connection for said control gate is located in said first well, said diffusion connection for said drain is located in said second well, and said diffusion connection for said source is located in said third well.

17. The integrated circuit of claim 9, further comprising a selection circuit for each said floating gate memory cell outside said continuous metal ring.

18. The integrated circuit of claim 16, comprising two of said floating gate memory cells within the same continuous metal ring, said two cells each having a respective selection transistor, outside of said continuous metal ring, and having, as the only common link with each other, their source connected to the same array ground signal, thereby providing a double UUPROM cell.

19. The integrated circuit of claim 18, wherein said double UUPROM cell has an axis of symmetry which separates it into two symmetrical structures, each having a floating gate memory cell.

20. The integrated circuit of claim 9, wherein each said diffused connection includes a well and, within this well and the semiconductor substrate, two facing diffusion zones; wherein said facing diffusion zones oppose each other in facing sides of equal length, said length being greater than the distance between said two facing sides.

21. The integrated circuit of claim 1, wherein most of the area of said floating gate is separated from said substrate by an insulating layer, and a fraction of the area of said floating gate is separated from said substrate only by a tunnel oxide which is electrically thinner than other portions of said insulating layer.

22. The integrated circuit of claim 1, wherein said metal ring is connected to a fixed voltage.

23. The integrated circuit of claim 1, comprising four of said floating-gate memory cells within each said ring.

24. An integrated circuit, comprising:
a monocrystalline semiconductor surface region of a first conductivity type; and one or more memory cells each comprising:
a metal mask completely covering a portion of said surface region, said mask having projections anchored to a first-conductivity-type portions of said surface region to define a metal ring totally surrounding said cell;
first, second, and third diffused connections, each of a second conductivity type, and each separately leading under said metal ring through said substrate;
an insulated thin-film layer portion within said metal ring, having a large fraction of the area thereof capacitively coupled to said first diffused connection;
said insulated thin-film layer portion having a first protrusion capacitively coupled to a channel region separating said second and third diffused connections, and not capacitively coupled to said first diffused connection;
said insulated thin-film layer portion having a second protrusion capacitively coupled to said second diffused connection through insulation which is thinner than insulation overlying said first diffused connection, and not capacitively coupled to said first diffused connection;
whereby said first diffused connection provides a control gate, and said layer portion provides a floating gate, and said first protrusion of said layer portion provides a field-effect transistor controlling current flow between said second and third diffused connections, and said second protrusion of said layer portion provides a write-injection path for injection of carriers to or from said floating gate; and further comprising
a select transistor interposed in said second diffused connection outside said metal ring.

25. The integrated circuit of claim 24, wherein said metal ring is connected to a fixed voltage.

26. The integrated circuit of claim 24, comprising four of said floating-gate memory cells within each said ring.

27. An integrated circuit, comprising:
a monocrystalline semiconductor surface region of a first conductivity type;
at least one plurality of memory cells on said surface region, each said memory cell comprising a control gate diffused into said surface, a floating gate insulated from said surface, and source and drain regions provided by respective diffusions in said surface;
a metal mask completely covering said floating gates, said mask having projections anchored to a first-conductivity-type portions of said surface region to define a metal ring totally surrounding said floating gates; and
multiple diffused connections, each of a second conductivity type, and each separately leading under said metal ring through said surface region, including:
a separate respective connection for each said control gate;
a separate respective connection or each said drain region; and
at least one shared connection, connected to said source regions of multiple ones of said plurality of memory cells.

28. The integrated circuit of claim 27, comprising exactly two of said floating-gate memory cells within each said ring.

29. The integrated circuit of claim 27, wherein most of the area of said floating gate is separated from said substrate by an insulating layer, and a fraction of the area of said floating gate is separated from said substrate only by a tunnel oxide which is electrically thinner than other portions of said insulating layer.

30. The integrated circuit of claim 27, wherein said metal ring is shaped as a rectangle with a rectangular indentation therein, and wherein said shared connection is contacted by a contact which lies outside said ring but within said indentation.

31. The integrated circuit of claim 27, comprising four of said floating-gate memory cells within each said ring.

* * * * *